United States Patent
Hiroshiro et al.

(10) Patent No.: US 8,468,943 B2
(45) Date of Patent: Jun. 25, 2013

(54) IMPRINT METHOD, COMPUTER STORAGE MEDIUM AND IMPRINT APPARATUS

(75) Inventors: Koukichi Hiroshiro, Koshi (JP); Takanori Nishi, Koshi (JP); Shoichi Terada, Koshi (JP); Takahiro Kitano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/393,250

(22) PCT Filed: Aug. 25, 2010

(86) PCT No.: PCT/JP2010/064376
§ 371 (c)(1),
(2), (4) Date: Feb. 29, 2012

(87) PCT Pub. No.: WO2011/027698
PCT Pub. Date: Mar. 10, 2011

(65) Prior Publication Data
US 2012/0152136 A1    Jun. 21, 2012

(30) Foreign Application Priority Data
Sep. 2, 2009    (JP) .................... 2009-202243

(51) Int. Cl.
| H01L 21/27 | (2006.01) |
| B29C 59/02 | (2006.01) |
| B41F 1/00 | (2006.01) |
| B41F 33/00 | (2006.01) |
| B05D 1/32 | (2006.01) |
| B01D 5/00 | (2006.01) |
| B01D 3/02 | (2006.01) |
| G01B 17/00 | (2006.01) |

(52) U.S. Cl.
USPC ........ 101/483; 101/287; 427/282; 427/372.2; 264/401; 264/406

(58) Field of Classification Search
USPC ....... 101/287, 483; 427/282, 372, 2; 264/320, 264/401, 406
See application file for complete search history.

(56) References Cited

U.S. PATENT DOCUMENTS
6,873,087 B1 * 3/2005 Choi et al. ............... 310/323.17
7,708,927 B2 * 5/2010 Suehira et al. ................ 264/319
(Continued)

FOREIGN PATENT DOCUMENTS
JP    2007-503120 A    2/2007
JP    2007-516862 A    6/2007
(Continued)

OTHER PUBLICATIONS
International Search Report mailed Nov. 30, 2010 in corresponding International Application No. PCT/JP2010/064376.

*Primary Examiner* — Daniel J Colilla
*Assistant Examiner* — Leo T Hinze
(74) *Attorney, Agent, or Firm* — Posz Law Group, PLLC (57) ABSTRACT

The present invention provides a method for applying an application liquid between a template and a substrate, and transferring the transfer pattern onto the application liquid. The template is inclinedly arranged with respect to the substrate in a manner that a first distance between a first end portion of the template and the substrate is a distance that causes a capillary action of the application liquid to occur, and a second distance between a second end portion of the template that opposes the first end portion and the substrate is a distance that does not cause the capillary action of the application liquid to occur. Thereafter, the application liquid is supplied from an outer side of the first end portion to the first end portion. Thereafter, the second end portion and the substrate are relatively moved so that the second distance becomes equal to the first distance.

14 Claims, 11 Drawing Sheets

U.S. PATENT DOCUMENTS

| | | | |
|---|---|---|---|
| 7,802,978 B2 * | 9/2010 | Sreenivasan et al. | 425/149 |
| 7,846,346 B1 * | 12/2010 | Kawakami et al. | 216/44 |
| 7,985,061 B2 * | 7/2011 | Suehira et al. | 425/150 |
| 2005/0084613 A1 | 4/2005 | Wang et al. | |
| 2005/0098534 A1 | 5/2005 | Sreenivasan et al. | |
| 2005/0274219 A1 | 12/2005 | Choi et al. | |
| 2005/0275311 A1 | 12/2005 | Choi et al. | |
| 2006/0005657 A1 * | 1/2006 | Choi et al. | 74/490.07 |
| 2009/0039550 A1 | 2/2009 | Suehira et al. | |

FOREIGN PATENT DOCUMENTS

| | | |
|---|---|---|
| JP | 2008-501245 A | 1/2008 |
| JP | 2008-504140 A | 2/2008 |
| JP | 2009-43998 A | 2/2009 |

* cited by examiner

IMPRINT METHOD, COMPUTER STORAGE MEDIUM AND IMPRINT APPARATUS

BACKGROUND OF THE INVENTION

1. Field of the Invention

The present invention relates to an imprint method, a computer storage medium, and an imprint apparatus, for applying an application liquid between a template having a transfer pattern formed on a surface thereof and a substrate, and transferring the transfer pattern onto the application liquid.

2. Description of the Related Art

For example, in a manufacturing process of a semiconductor device, a predetermined resist pattern is formed on, for example, a semiconductor wafer (which is referred to as "wafer" in the following). When the resist pattern is formed, in order to meet the demands for miniaturization of the resist pattern in recent years, it has been proposed to use a method known as so-called an imprint method.

In the imprint method, a template (which is sometimes referred to as a mold or a stamp) having a fine pattern on a surface thereof is used. Then, after a resist liquid is applied on, for example, a wafer, the template is pressed against the resist surface on the wafer to perform a direct transfer of the pattern onto the resist surface.

Such pattern transfer is usually performed a plurality of times with respect to one wafer. That is, the template is pressed against one wafer for a plurality of times. Therefore, a method for continuously performing such pattern transfer has been proposed. In this method, first, the template is inclinedly arranged with respect to the wafer. Next, while the template is moved, the resist liquid is continuously supplied into between the template and the wafer. Thereafter, when the template reaches a predetermined target position, the template is rotated to the wafer side, and the template is pressed against the resist surface. Then, such movement of the template, supplying the resist liquid, and pressing the template against the resist surface are repeatedly performed, and the pattern transfer onto the one wafer is continuously performed (Patent Document 1).

Patent Document 1: JP Laid-Open Patent Publication No. 2009-43998.

SUMMARY OF THE INVENTION

However, in the above-described imprint method, when the template is pressed against the resist surface on the wafer, atmosphere between the template and the resist does not completely flow out, so that air bubbles remain between the template and resist. When the air bubbles remain, defects occur in the resist pattern formed on the wafer.

In order to inhibit defects in the resist pattern, it is possible to perform the process of pressing the template against the resist surface in a high pressure atmosphere to dissolve the air bubbles in the resist. Further, it is also possible to replace the atmosphere of the process with a He gas to make the air bubbles easily dissolved in the resist. Further, in order not to cause the air bubbles to occur, it is also possible to make the atmosphere of the process into a vacuum state.

However, in the case of performing the process in the high pressure atmosphere or in the He gas atmosphere, it takes time to dissolve the air bubbles in the resist. In particular, in the case of performing the process in the He gas atmosphere, it takes time to replace the atmosphere with the He gas. Thus, the throughput of the wafer process deteriorates. Further, in the case of making the atmosphere of the process into a vacuum state, dedicated container, pump, and the like are required so that a lot of equipments are involved, and, in addition, forming a vacuum state is time consuming and extremely difficult. Therefore, at present, eliminating the air bubbles between the template and the resist is in a difficult situation.

The present invention was accomplished in view of such points, and a purpose of the present invention is to adequately apply an application liquid between a template and a substrate without causing air bubbles to occur.

To achieve the above purpose, the present invention provides an imprint method for applying an application liquid between a template having a transfer pattern formed on a surface thereof and a substrate, and transferring the transfer pattern onto the application liquid. The imprint method includes an arrangement step inclinedly arranging the template with respect to the substrate in a manner that the surface of the template opposes the substrate, and that a first distance between a first end portion of the template and the substrate is a distance that causes a capillary action of the application liquid to occur between the template and the substrate, and a second distance between a second end portion of the template that opposes the first end portion and the substrate is a distance that does not cause the capillary action of the application liquid to occur; thereafter, a supply step supplying the application liquid from an outer side of the first end portion to the first end portion; and, thereafter, a movement step relatively moving the second end portion and the substrate so that the second distance becomes equal to the first distance.

According to the present invention, first, at the arrangement step, the template is arranged in a manner as described above. Thereafter, at the supply step, the application liquid is supplied from the outer side of the first end portion of the template to the first end portion. Then, the supplied application liquid diffuses on the first end portion side via the capillary action. Thereafter, at the movement step, the second end portion and the substrate are relatively moved in a manner that the second distance becomes equal to the first distance. Therefore, the application liquid diffused on the first end portion side diffuses toward the second end portion side via the capillary action. As described above, the application liquid continuously diffuses between the template and the substrate. Therefore, atmosphere between the template and the substrate can be driven to outside. Therefore, the application liquid can be adequately applied between the template and the substrate, without causing air bubbles to occur.

Further, according to the present invention, it is not required to make the atmosphere of the process into a high pressure atmosphere and a He gas atmosphere, or into a vacuum state, as described above. Therefore, the throughput of the substrate process does not deteriorate. Further, the present invention does not need equipment for changing the state of the atmosphere of the process and also does need to use expensive He gas. Therefore, the cost of the substrate process can be reduced.

A state of the application liquid at the movement step may be inspected, and, based on a result of this inspection, at least the arrangement of the template at the arrangement step or the relative movement of the second end portion and the substrate at the movement step may be controlled. The state of the application liquid is, for example, a state in which the application liquid diffuses between the template and the substrate.

The present invention according to another viewpoint is a computer-readable non-transitory storage medium storing a program that runs on a computer of a controller controlling an imprint apparatus in order to execute, by using the imprint apparatus, the above-described imprint method.

The present invention according to yet another viewpoint is an imprint apparatus for applying an application liquid between a template having a transfer pattern formed on a surface thereof and a substrate, and transferring the transfer pattern onto the application liquid. The imprint apparatus includes a template holding part holding the template; a movement mechanism relatively moving the template held by the template holding part and the substrate; an application liquid supply part supplying the application liquid; and a controller. The controller controls the movement mechanism to execute an arrangement step inclinedly arranging the template with respect to the substrate in a manner that the surface of the template opposes the substrate, and that a first distance between a first end portion of the template and the substrate is a distance that causes a capillary action of the application liquid to occur between the template and the substrate, and a second distance between a second end portion of the template that opposes the first end portion and the substrate is a distance that does not cause the capillary action of the application liquid to occur. Thereafter, the controller controls the application liquid supply part to execute a supply step supplying the application liquid from an outer side of the first end portion to the first end portion. Thereafter, the controller controls the movement mechanism to execute a movement step relatively moving the second end portion and the substrate so that the second distance becomes equal to the first distance.

BRIEF DESCRIPTION OF THE DRAWINGS

FIGS. 6A-6E schematically illustrate states of the template and a wafer at the respective steps of the imprint process.

FIGS. 7A-7C illustrate states of the resist liquid at the respective steps of the imprint process.

FIGS. 13A-13E schematically illustrate states of a template and a wafer at respective steps of an imprint process.

DETAILED DESCRIPTION OF THE INVENTION

Figure 1:
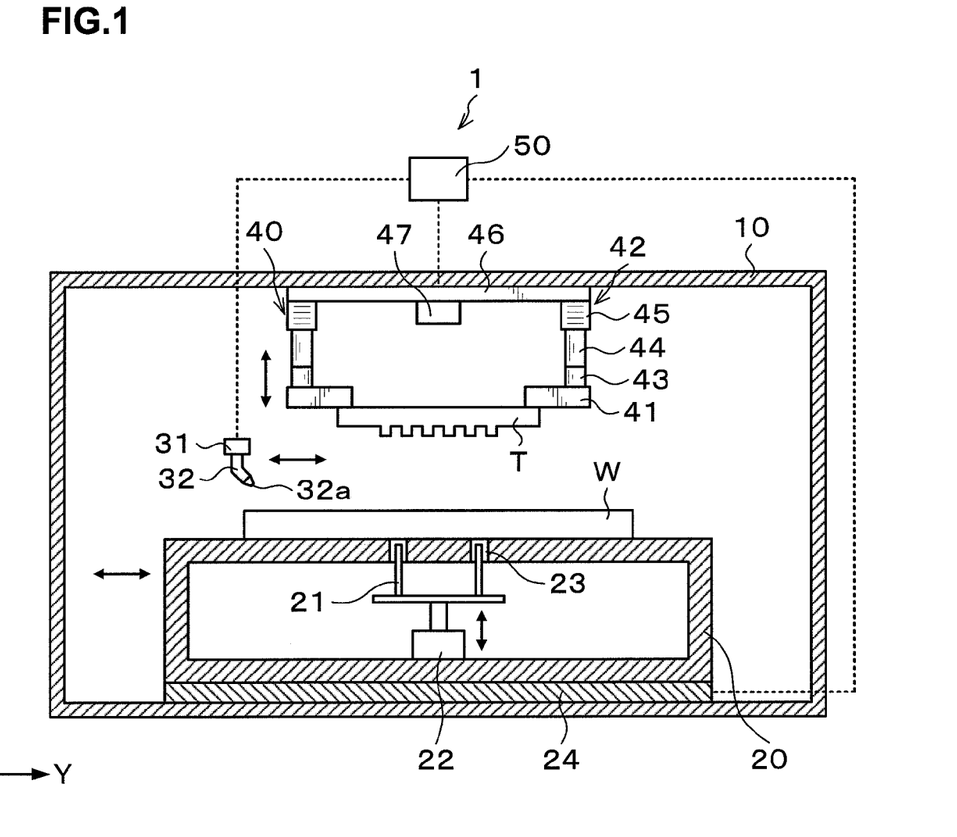
FIG. 1 illustrates a longitudinal sectional view of an outline of a configuration of an imprint apparatus according to the present embodiment.
Figure 2:
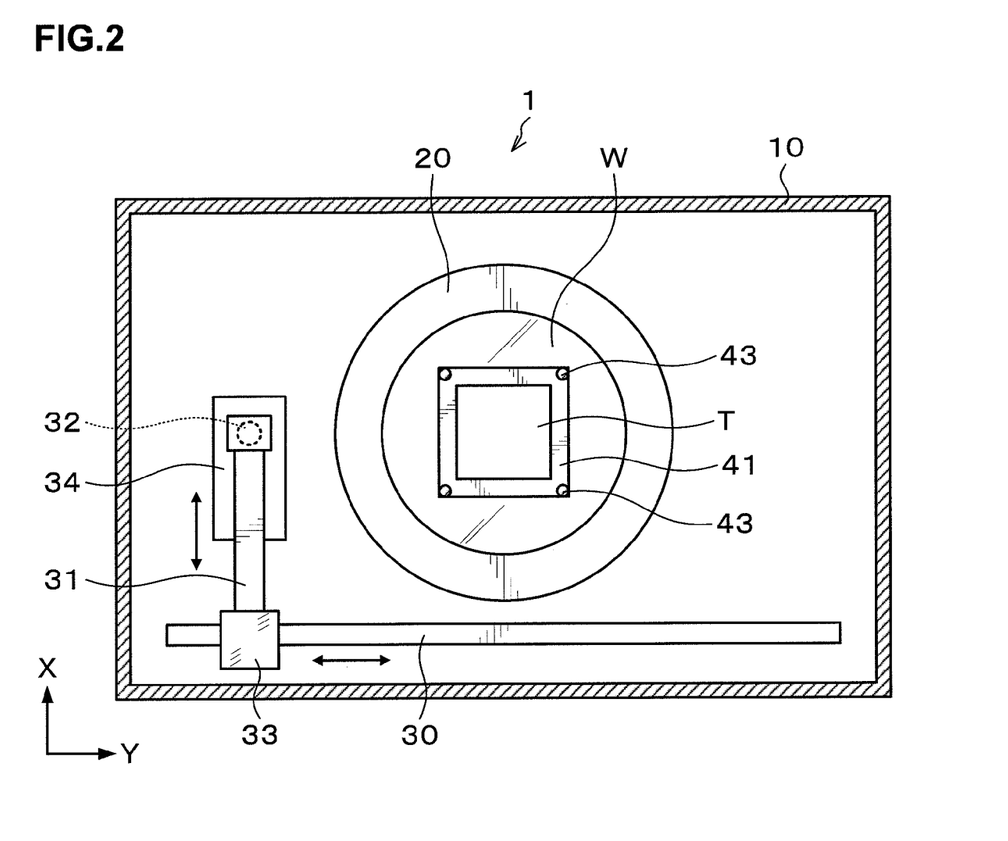
FIG. 2 illustrates a horizontal sectional view of the outline of the configuration of the imprint apparatus according to the present embodiment.

In the following, an embodiment of the present invention is explained. FIG. 1 illustrates a longitudinal sectional view of an outline of a configuration of an imprint apparatus 1 according to the present embodiment. FIG. 2 illustrates a horizontal sectional view of the outline of the configuration of the imprint apparatus 1. Since priority is given to ease of understanding of the technology, a ratio between sizes of a template T and a wafer W illustrated in FIGS. 1 and 2 does not necessarily correspond to a ratio between actual sizes.

Figure 3:
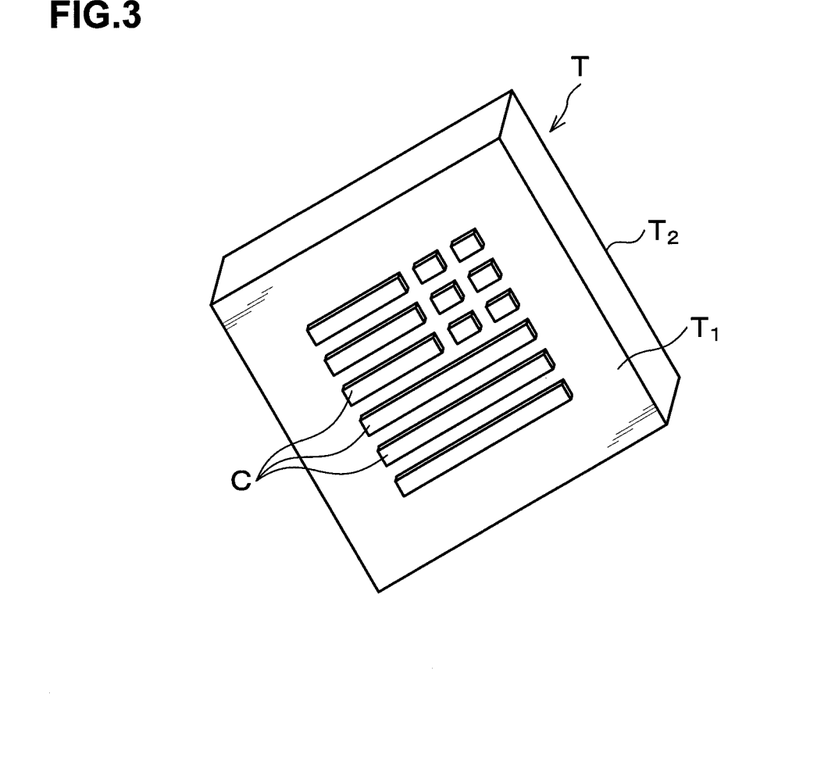
FIG. 3 illustrates a perspective view of a template.
Figure 4:
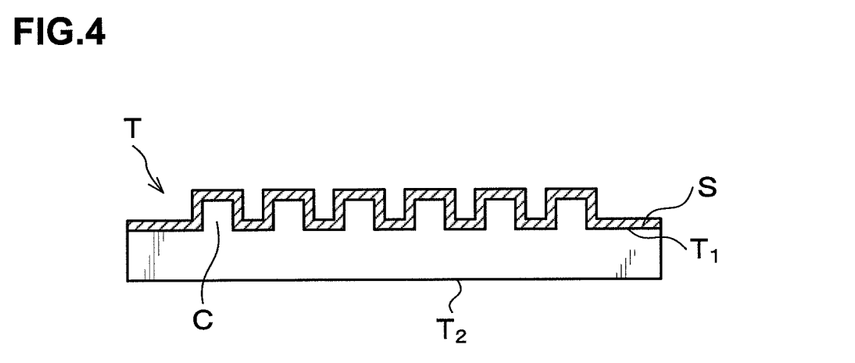
FIG. 4 illustrates a side view of the template.

In the imprint apparatus 1 of the present embodiment, as FIG. 3 illustrates, the template T is used that has a rectangular shape in a plan view and has a predetermined transfer pattern C formed on a surface of the template T. In the following, a surface of the template T on which the transfer pattern C is formed is referred to as a surface $T_1$ and a surface on an opposite side of the surface $T_1$ is referred to as a back surface $T_2$. On the surface $T_1$ of the template T, as FIG. 4 illustrates, a release agent S is deposited along the shape of the transfer pattern C. A transparent material, for example, a glass, capable of transmitting light such as visible light, near-ultraviolet light, and ultraviolet light, is used for the template T. Further, a material, for example, a fluorine resin and the like, having liquid repellency with respect to a resist liquid on a wafer, to be described later, is used for the material of the release agent S.

As FIG. 1 illustrates, the imprint apparatus 1 has a casing 10, on a lateral side of which a carry-in/out port (not illustrated in the figure) for the template T and a carry-in/out port (not illustrated in the figure) for the wafer W are formed.

On a bottom surface inside the casing 10, a wafer holding part 20 is provided on which the wafer W is mounted and held. The wafer W is mounted on an upper surface of the wafer holding part 20 in a manner that a to-be-treated surface of the wafer W is facing upward. Inside the wafer holding part 20, lift pins 21 are provided for supporting the wafer W from below and for raising and lowering the wafer W. The lift pins 21 can be moved in an up-down direction by a lift driving part 22. On the upper surface of the wafer holding part 20, through-holes 23 are formed penetrating the upper surface in a thickness direction, and the lift pins 21 are inserted through the through-holes 23. Further, the wafer holding part 20 can be moved in a horizontal direction and freely rotated about a vertical axis by a wafer moving mechanism 24 provided below the wafer holding part 20.

As FIG. 2 illustrates, on a negative X direction (downward direction in FIG. 2) side of the wafer holding part 20, a rail 30 is provided extending along a Y direction (left-right direction in FIG. 2). The rail 30 is formed, for example, from a lateral side on a negative Y direction (leftward direction in FIG. 2) side of the wafer holding part 20 to a lateral side on a positive Y direction (rightward direction in FIG. 2) side of the wafer holding part 20. An arm 31 is attached to the rail 30.

A resist liquid nozzle 32 is supported on the arm 31, as an application liquid supply part supplying a resist liquid as an application liquid on the wafer W. The resist liquid nozzle 32 has, at a lower end portion, a supply port 32a supplying the resist liquid, and the orientation of the supply port 32a is configured to be freely changeable. In the present embodiment, the resist liquid nozzle 32 is arranged in a manner that the supply port 32a faces obliquely downward. Further, the resist liquid nozzle 32 is, for example, a dispenser nozzle, and can precisely control supply timing of the resist liquid, supply amount of the resist liquid, and the like.

The arm 31 can be freely moved on the rail 30 by a nozzle driving part 33. This allows the resist liquid nozzle 32 to be able to move, for example, from a standby part 34 provided at the lateral side on the negative Y direction side of the wafer holding part 20 to a position above the wafer W on the wafer holding part 20, and further to be able to move in a radial direction of the wafer W on the surface of the wafer W. Further, the arm 31 can be freely moved up and down by the nozzle driving part 33 so that the height of the resist liquid nozzle 32 can be adjusted.

As FIG. 1 illustrates, a template holding part 40 holding the template T is provided on a ceiling surface inside the casing 10 and above the wafer holding part 20. That is, the wafer holding part 20 and the template holding part 40 are arranged in a manner that the wafer W mounted on the wafer holding part 20 and the template T held by the template holding part 40 are opposing each other.

The template holding part 40 has a chuck 41 suction-holding an outer periphery of the back surface $T_2$ of the template T. The chuck 41 is supported by a template moving mechanism 42 provided above the chuck 41. The chuck 41 can be freely moved in the vertical direction and freely rotated about a vertical axis by the template moving mechanism 42.

The template moving mechanism 42 has piezoelectric mechanisms 43, ball screws 44, micrometers 45, and a rotation mechanism 46. The piezoelectric mechanisms 43, the ball screws 44, and the micrometers 45 are provided in this order from below on the chuck 41. Further, as FIG. 2 illustrates, the piezoelectric mechanisms 43, the ball screws 44, and the micrometers 45 are provided at four corners of the chuck 41. Each of the ball screws 44 approximately adjusts a vertical position of the template T, and each of the piezoelectric mechanisms 43 performs fine adjustment of the vertical position of the template T. Further, each of the micrometers 45 measures and manages the vertical position of the template T. By using such a template moving mechanism 42, the vertical positions of the four corners of the template T are independently adjusted, and the template T can be raised and lowered with respect to the wafer W on the wafer holding part 20.

As FIG. 1 illustrates, the rotation mechanism 46 is provided above the micrometers 45. By using this rotation mechanism 46, the template T can be rotated to a predetermined orientation with respect to the wafer W on the wafer holding part 20.

The template holding part 40 has a light source 47 provided above the template T held by the chuck 41. The light source 47 emits light such as visible light, near-ultraviolet light, and ultraviolet light, and the light emitted from this light source 47 transmits through the template T and radiates downward.

As FIG. 1 illustrates, in the above-described imprint apparatus 1, a controller 50 is provided. The controller 50 is, for example, a computer, and has a program storage (not illustrated in the figure). The program storage stores, for example, a program for controlling the operations of drive systems such as the wafer moving mechanism 24, the template moving mechanism 42, and the nozzle driving part 33, and the operation of supplying the resist liquid via the resist liquid nozzle 32, and the like, to execute an imprint process, to be described later, in the imprint apparatus 1. The program is recorded on a computer-readable storage medium such as a computer-readable hard disk (HD), a flexible disk (FD), a compact disk (CD), a magnetic optical disk (MO), and a memory card, and may also be installed from the storage medium to the controller 50.

Figure 5:
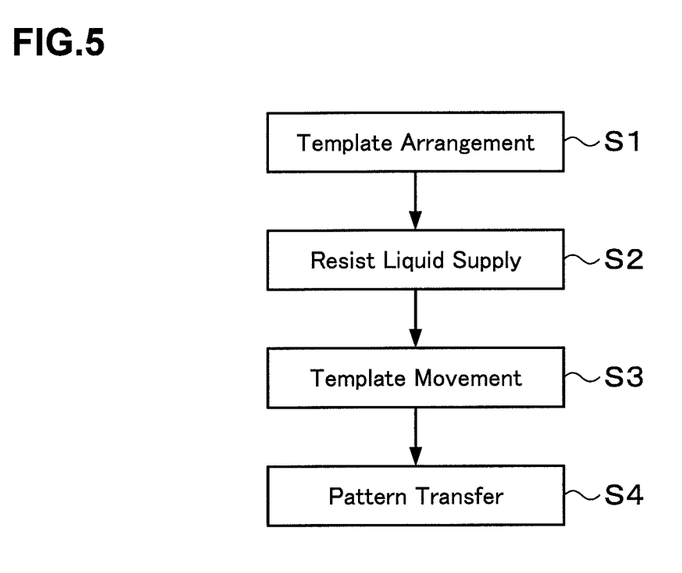
FIG. 5 is a flow diagram illustrating respective steps of an imprint process.

The imprint apparatus 1 according to the present embodiment is configured as described above. Next, an imprint process performed by using the imprint apparatus 1 is explained. FIG. 5 illustrates a process flow of major steps of the imprint process. Further, FIGS. 6A-6E illustrate states of the template T and the wafer W at the steps of the imprint process, and FIGS. 7A-7C illustrate states of the resist liquid between the template T and the wafer W.

First, the template T and the wafer W are carried into the imprint apparatus 1. The template T carried into the imprint apparatus 1 is suction-held by the chuck 41 of the template holding part 40 in a state in which the surface $T_1$ of the template T faces downward. Further, the wafer W carried into the imprint apparatus 1 is received by the lift pins 21 in a state in which the to-be-treated surface of the wafer W faces upward, and is mounted and held on the wafer holding part 20.

Next, by using the wafer moving mechanism 24, the wafer W held by the wafer holding part 20 is moved to a predetermined position in the horizontal direction to perform position alignment. Further, by using the template moving mechanism 42, the template T held by the template holding part 40 is rotated to a predetermined orientation. Thus, the surface $T_1$ of the template T and the to-be-treated surface of the wafer W are arranged opposing each other.

Figure 6A:
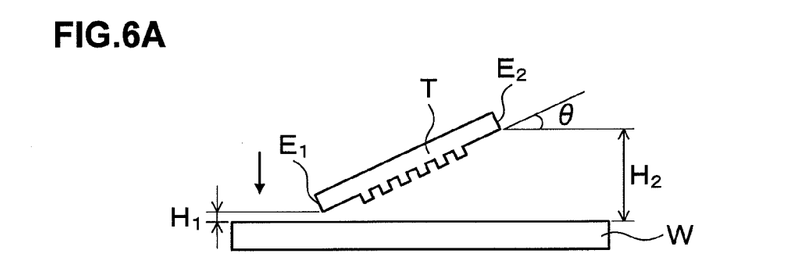
FIG. 6A illustrates a state in which the template is arranged at a predetermined position.
Figure 7A:
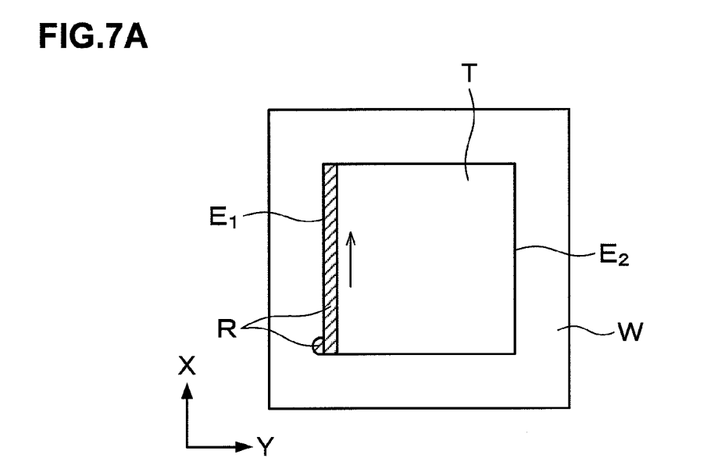
FIG. 7A illustrates a state in which the resist liquid diffuses along the first end portion of the template.
Figure 7B:
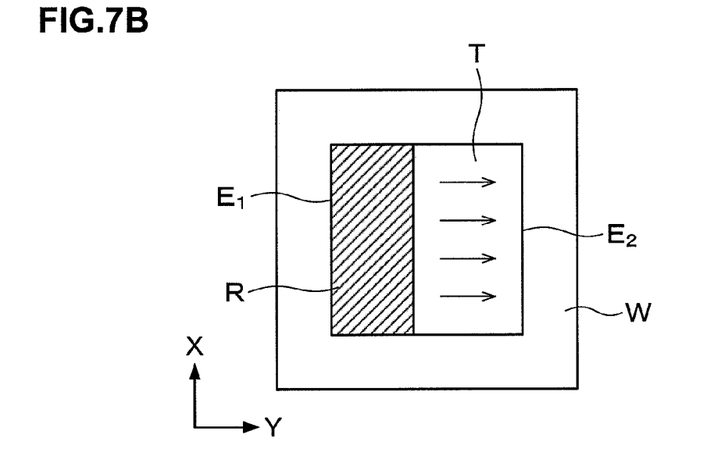
FIG. 7B illustrates a state in which the resist liquid diffuses toward the second end portion of the template.
Figure 7C:
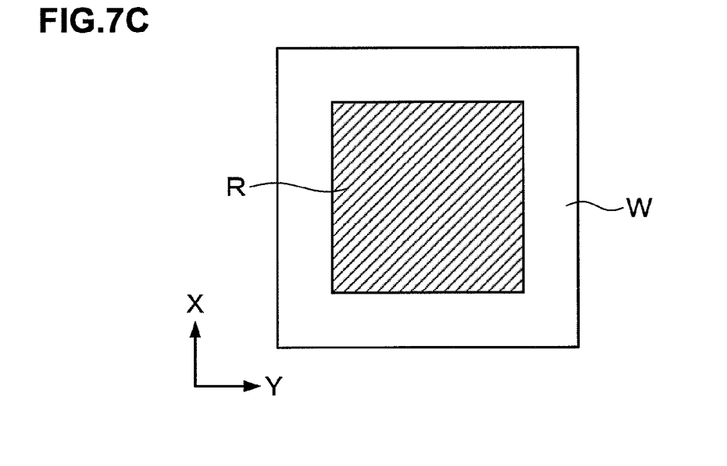
FIG. 7C illustrates a state in which the resist liquid has diffused between the template and the wafer.

Next, by using the template moving mechanism 42, as FIG. 6A illustrates, the template T is lowered toward the wafer W side to be arranged at a predetermined position (S1 in FIG. 5). In this case, by using the ball screws 44 and the piezoelectric mechanisms 43, the vertical positions of the four corners of the template T are adjusted so that the template T is inclinedly arranged at a predetermined inclination angle θ of, for example, 5 degrees-10 degrees, with respect to the wafer W. Further, a first distance $H_1$ between a first end portion $E_1$ of the template T and the wafer W is, for example, 10 nm-500 nm. This first distance $H_1$ is a distance that causes a capillary action of the resist liquid to occur between the first end portion $E_1$ of the template T and the wafer W. Further, a second distance $H_2$ between a second end portion $E_2$ of the template T that opposes the first end portion $E_1$ and the wafer W is, for example, 3 mm-5 mm. This second distance $H_2$ is a distance that does not cause the capillary action of the resist liquid to occur between the second end portion $E_2$ of the template T and the wafer W.

Figure 6B:
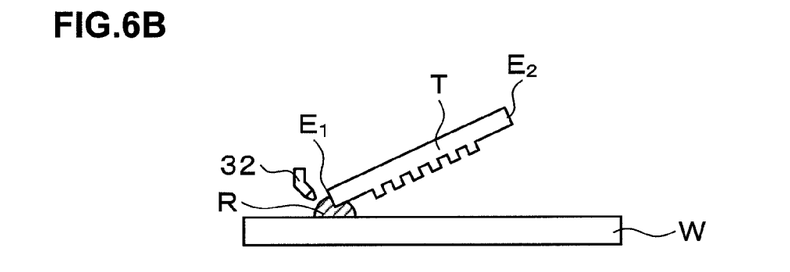
FIG. 6B illustrates a state in which a resist liquid is supplied to a first end portion of the template.

Thereafter, as FIG. 6B illustrates, the resist liquid nozzle 32 is moved to an outer side of the first end portion $E_1$ of the template T. Next, a predetermined amount, for example, 100 ml, of a resist liquid R is supplied from the resist liquid nozzle 32 to the outer side of the first end portion $E_1$ of the template T (S2 in FIG. 5). In this case, as FIG. 7A illustrates, the resist liquid R is supplied to one corner of the template T. The supply amount of the resist liquid R is an amount necessary for applying the resist liquid R with a predetermined film thickness between the template T and the wafer W, and is controlled by the controller 50.

As FIG. 7A illustrates, the resist liquid R supplied from the resist liquid nozzle 32 enters between the template T and the wafer W via the capillary action and diffuses into an inner side of the template T along the first end portion $E_1$ in the positive X direction (upward direction in FIG. 7A). In this case, the template T is inclinedly arranged with respect to the wafer W. Therefore, the resist liquid R does not diffuse to the second end portion $E_2$ side.

Figure 6C:
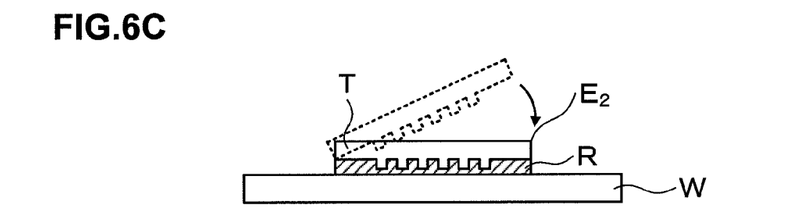
FIG. 6C illustrates a state in which a second end portion of the template is moved toward the wafer side.

Thereafter, as FIG. 6C illustrates, by using the template moving mechanism 42, the second end portion $E_2$ of the template T is moved toward the wafer W side (S3 in FIG. 5). Then, as FIG. 7B illustrates, the resist liquid R diffuses toward the second end portion $E_2$ of the template T. This is because the capillary action of the resist liquid R occurs between the template T and the wafer W as the distance between the template T and the wafer W gradually decreases in the positive Y direction (rightward direction in FIG. 7B). Therefore, the resist liquid R diffuses in a manner that a front end portion of the resist liquid R is parallel to the first end portion $E_1$ and the second end portion $E_2$.

Then, as FIG. 6C illustrates, until the above-described second distance $H_2$ is equal to the first distance $H_1$, that is, until the template T and the wafer W become parallel, the second end portion $E_2$ of the template T is moved toward the wafer W side. Then, as FIG. 7C illustrates, the resist liquid R diffuses over the entire surface between the template T and the wafer W. As described above, the resist liquid R continuously diffuses between the template T and the wafer W. Therefore, atmosphere between the template T and the wafer W can be driven to outside.

Figure 6D:
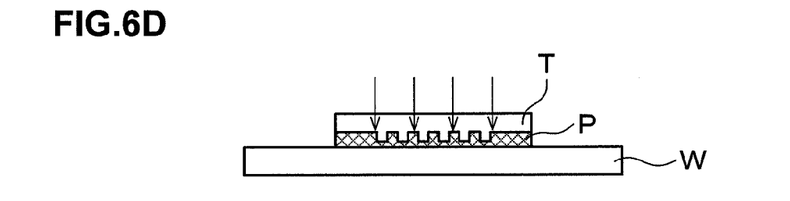
FIG. 6D illustrates a state in which the resist liquid is irradiated with light.

Next, as FIG. 6D illustrates, the resist liquid R on the wafer W is irradiated with light from the light source 47. The light from the light source 47 transmits through the template T and radiates on the resist liquid R on the wafer W. This allows the resist liquid R to be cured and photo-polymerized. As described above, the transfer pattern C of the template T is transferred onto the resist liquid R on the wafer W, and a resist pattern P is formed (S4 in FIG. 5).

Figure 6E:
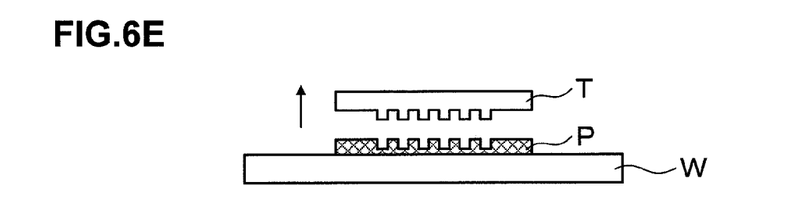
FIG. 6E illustrates a state in which the template is raised.

Thereafter, as FIG. 6E illustrates, the template T is raised. In this case, the release agent S is applied on the surface $T_1$ of the template T. Therefore, the resist on the wafer W does not attach to the surface $T_1$ of the template T. A thin residual film of the resist may remain in a recess portion of the resist pattern P formed on the wafer W. However, the residual film may be removed, for example, outside the imprint apparatus 1.

Thus, the resist pattern P is formed on the wafer W, and the sequential imprint process terminates.

According to the above embodiment, first, at S1, the template T is inclinedly arranged with respect to the wafer W in a manner that the first distance $H_1$ is a distance that causes the capillary action of the resist liquid R to occur and the second distance $H_2$ is a distance that does not cause the capillary action of the resist liquid R to occur. This allows the resist liquid R supplied from the outer side of the first end portion $E_1$ of the template T at the following S2 to diffuse along the first end portion $E_1$ via the capillary action. Thereafter, at S3, the second end portion $E_2$ of the template T is moved toward the wafer W side. Therefore, the resist liquid R diffuses toward the second end portion $E_2$ side via the capillary action. As described above, the resist liquid R continuously diffuses between the template T and the wafer W. Therefore, atmosphere between the template T and the wafer W can be driven to outside. Therefore, the resist liquid R can be adequately applied between the template T and the wafer W, without causing air bubbles to occur.

Figure 8:
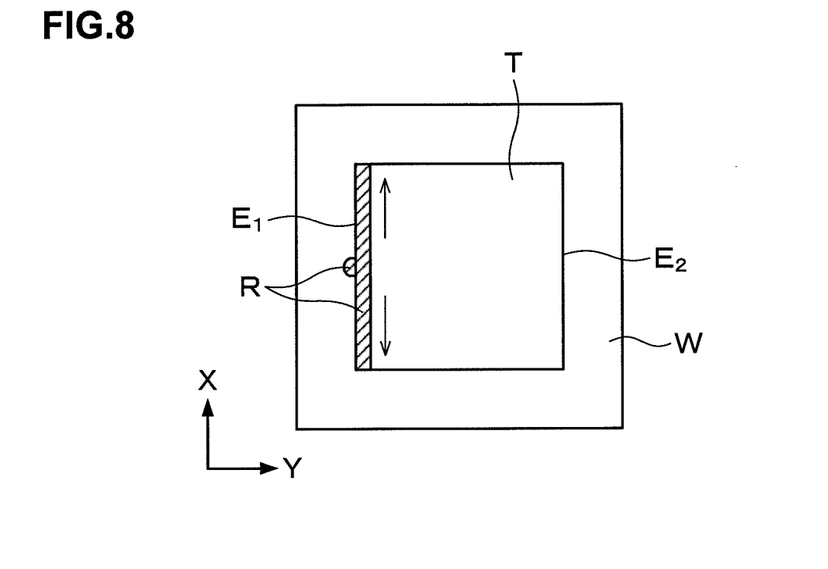
FIG. 8 illustrates a state in which the resist liquid diffuses along the first end portion of the template in a case where an imprint method according to another embodiment is used.

In the above embodiment, at S2, the resist liquid R is supplied to one corner of the template T. However, the resist liquid R may also be supplied to another point of the first end portion $E_1$ of the template T. For example, as FIG. 8 illustrates, the resist liquid R may also be supplied to a central portion of the first end portion $E_1$. In this case, the resist liquid R supplied to the outer side of the first end portion $E_1$ enters between the template T and the wafer W and diffuses into the inner side of the template T along the first end portion $E_1$ in the positive X direction (upward in FIG. 8) and in the negative X direction (downward in FIG. 8). In the present embodiment, other steps of the imprint process are the same as S1, S3, and S4 of the above-described embodiment, and therefore their explanation is omitted.

Figure 9:
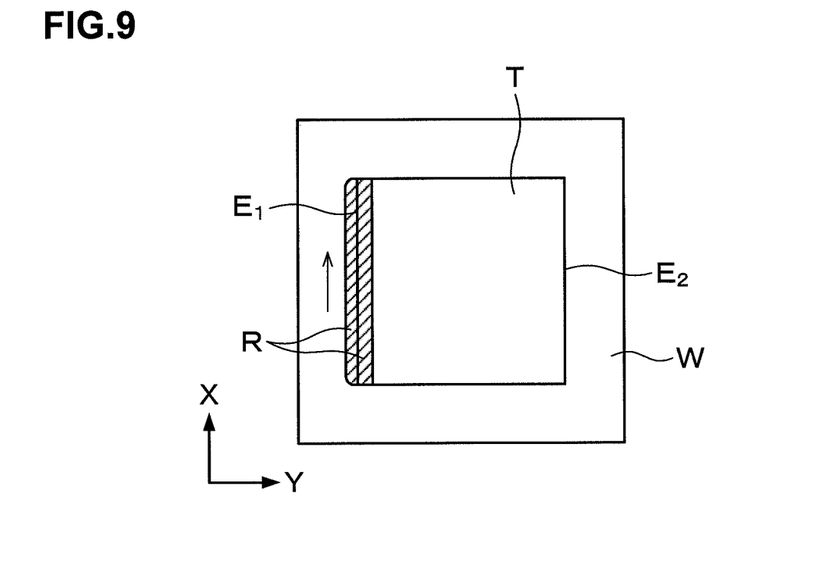
FIG. 9 illustrates a state in which the resist liquid diffuses along the first end portion of the template in a case where an imprint method according to yet another embodiment is used.

Further, in the above embodiment, at S2, the resist liquid R is supplied to one point of the first end portion $E_1$ of the template T. However, for example, as FIG. 9 illustrates, the resist liquid R may also be continuously supplied along the first end portion $E_1$. In this case, for example, the resist liquid R may be supplied while the resist liquid nozzle 32 is moved along the first end portion $E_1$ in the positive X direction (upward direction in FIG. 9). Then, the supplied resist liquid R enters the inner side of the template T, and diffuses to the first end portion $E_1$ side. In the present embodiment, other steps of the imprint process are the same as S1, S3, and S4 of the above-described embodiment, and therefore their explanation is omitted.

The supplying of the resist liquid R at S2 of the above embodiment may also be continued to be intermittently performed at S3. In this case, the resist liquid R is supplied from the resist liquid nozzle 32 in such a manner that the sum of the supply amount of the resist liquid R at S2 and the supply amount of the resist liquid R at S3 equal to the above-mentioned predetermined amount. Even in this case, as illustrated in FIGS. 7A-7C, at S2, the resist liquid R diffuses along the first end portion $E_1$ of the template T, and thereafter, at S3, the resist liquid R diffuses toward the second end portion $E_2$ side.

Figure 10:
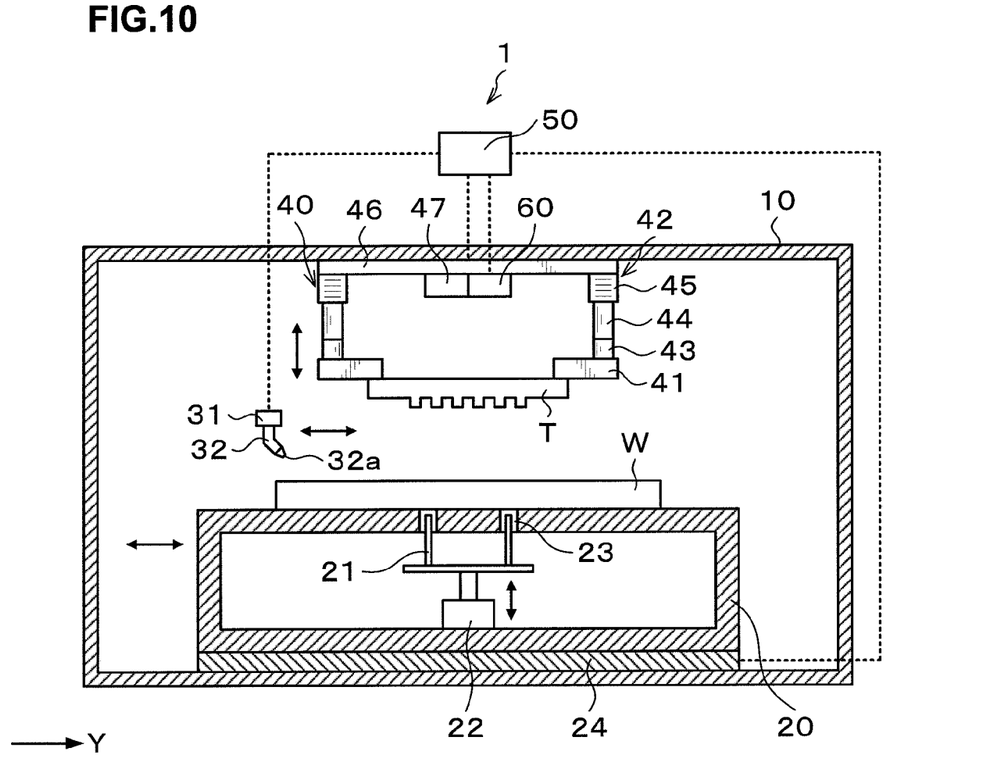
FIG. 10 illustrates a longitudinal sectional view of an outline of a configuration of an imprint apparatus according to yet another embodiment.

As FIG. 10 illustrates, the imprint apparatus 1 of the above embodiment may further have an inspection part 60 inspecting the state of the resist liquid R, that is, the state in which the resist liquid R diffuses between the template T and the wafer W. The inspection part 60 is provided above the template T held by the chuck 41, and is arrange, for example, adjacent to the light source 47. For example, a wide-angle CCD camera is used in the inspection part 60. Then, since the template T is of a transparent material, the inspection part 60 can inspect spreading of the resist liquid R between the template T and the wafer W. Further, the inspection part 60 is connected to the controller 50. Other configurations of the imprint apparatus 1 are the same as the configurations of the imprint apparatus 1 of the above-described embodiment, and therefore their explanation is omitted. Further, steps of the imprint process performed in the imprint apparatus 1 of the present embodiment are also the same as S1-S4 of the above-described embodiment.

In this case, as FIG. 7B illustrates, at S3, when the resist liquid R diffuses toward the second end portion $E_2$ side of the template T, the inspection part 60 inspects the spreading of the resist liquid R. A result of this inspection is output to the controller 50. Based on the inspection result, the controller 50 confirms whether the resist liquid R is adequately diffusing, for example, whether the resist liquid R is diffusing in a manner parallel to the first end portion $E_1$ and the second end portion $E_2$. Then, when the resist liquid R is not adequately diffusing, the piezoelectric mechanisms 43 and the ball screws 44 of the template moving mechanism 42 are feedback-controlled. Specifically, the arrangement of the template T at S1, for example, the balance of the template T in the horizontal direction, the movement of the template T at S3, for example, the moving speed, and the like, are adjusted. As described above, the template moving mechanism 42 can be feedback-controlled. Therefore, the subsequent imprint process can be adequately performed.

Further, by using the inspection part 60, at S3, that the resist liquid R has diffused over the entire surface between the template T and the wafer W can be inspected. Then, when the resist liquid R has diffused over the entire surface, the controller 50 can control the template moving mechanism 42 in a manner to terminate S3.

Figure 11:
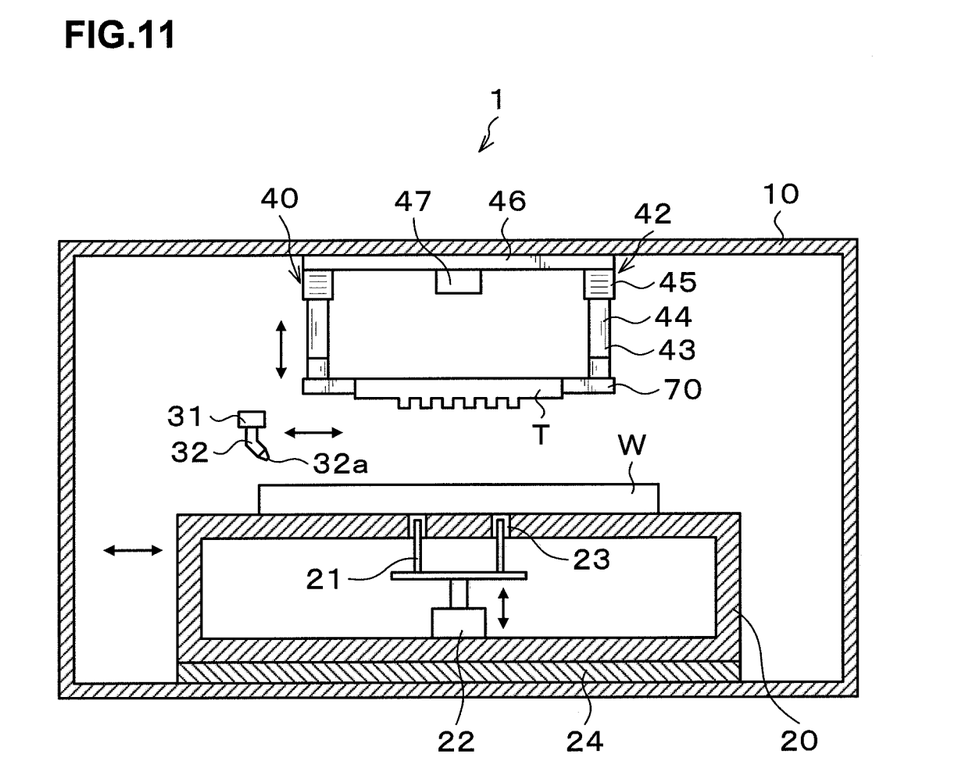
FIG. 11 illustrates a longitudinal sectional view of an outline of a configuration of an imprint apparatus according to yet another embodiment.

In the above embodiment, the chuck 41 of the template holding part 40 suction-holds the template T. However, instead of the chuck 41, as FIG. 11 illustrates, a clamp 70 may be provided. The clamp 70 can mechanically hold the periphery side of the template T. Further, it is also possible to screw-mount the template T and the template holding part 40 so that the template holding part 40 holds the template T.

In the above embodiment, in the imprint apparatus 1, the template holding part 40 is provided above the wafer holding part 20. However, the template holding part may also be provided below the wafer holding part.

Figure 12:
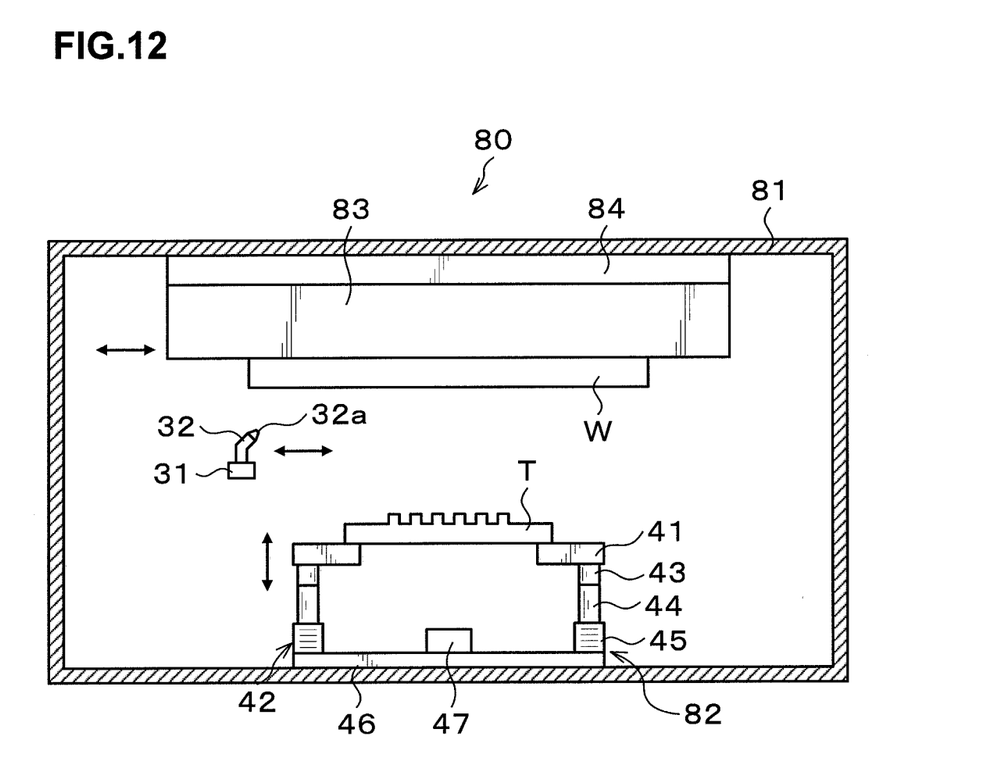
FIG. 12 illustrates a longitudinal sectional view of an outline of a configuration of an imprint apparatus according to yet another embodiment.

In this case, as FIG. 12 illustrates, a template holding part 82 is provided on a bottom surface of a casing 81 of an imprint apparatus 80. The template holding part 82 has the same configuration as the template holding part 40 illustrated in FIGS. 1 and 2, and is obtained by arranging the template holding part 40 by inverting it in the vertical direction. Therefore, the template T is held by the template holding part 82 in a manner that the surface $T_1$ of the template T faces upward. Further, light emitted from the light source 47 of the template holding part 82 radiates upward.

A wafer holding part 83 is provided on a ceiling surface of the casing 81 and above the template holding part 82. The wafer holding part 83 suction-holds a back surface of the wafer W in a manner that the to-be-treated surface of the wafer W faces downward. The wafer holding part 83 can be moved in the horizontal direction by a moving mechanism 84 provided above the wafer holding part 83.

Further, the resist liquid nozzle 32 is arranged in a manner that the supply port 32a faces obliquely upward.

Other configurations of the imprint apparatus 80 are the same as the configurations of the imprint apparatus 1 illustrated in FIGS. 1 and 2, and therefore their explanation is omitted.

Next, an imprint process performed by using the imprint apparatus 80 configured as described above is explained. FIGS. 13A-13E illustrate states of the template T and the wafer W at respective steps of the imprint process.

First, the template T and the wafer W are carried into the imprint apparatus 80, and are respectively held by the template holding part 82 and the wafer holding part 83. Next, the template T held by the template holding part 82 is rotated to a predetermined orientation to perform position alignment, and the wafer W held by the wafer holding part 83 is moved to a predetermined position in the horizontal direction to perform position alignment.

Figure 13A:
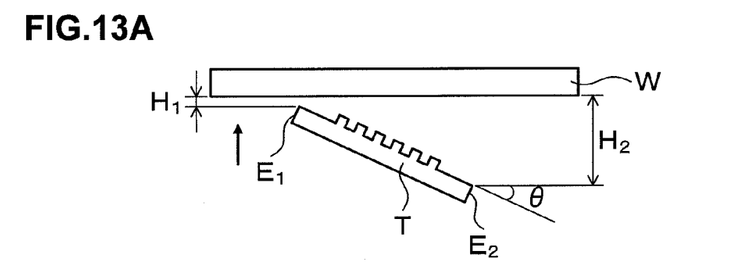
FIG. 13A illustrates a state in which the template is arranged at a predetermined position.

Next, by using the template moving mechanism 42, as FIG. 13A illustrates, the template T is raised toward the wafer W side to be arranged at a predetermined position. In this case, the inclination angle θ of the template T, the first distance $H_1$, and the second distance $H_2$ are the same as in the above-described embodiment, and therefore, their explanation is omitted.

Figure 13B:
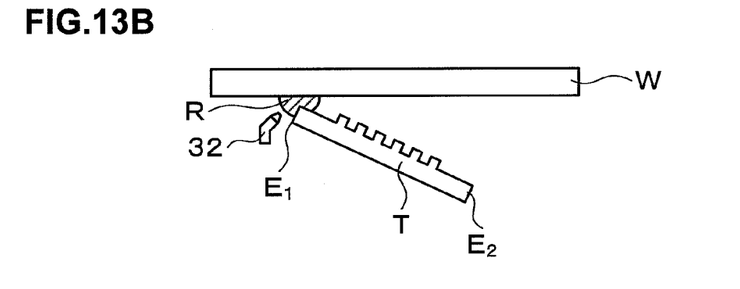
FIG. 13B illustrates a state in which a resist liquid is supplied to a first end portion of the template.

Thereafter, as FIG. 13B illustrates, the resist liquid nozzle 32 is moved to the outer side of the first end portion $E_1$ of the template T. Next, a predetermined amount of the resist liquid R is supplied from the resist liquid nozzle 32 to the outer side of the first end portion $E_1$. In this case, the supply amount of the resist liquid R is a small amount and the resist liquid R has a viscosity of a considerable degree. Therefore, the supplied resist liquid R does not fall down. Then, as FIG. 7A illustrates, the resist liquid R enters between the template T and the wafer W via the capillary action and diffuses into the inner side of the template T along the first end portion $E_1$.

Figure 13C:
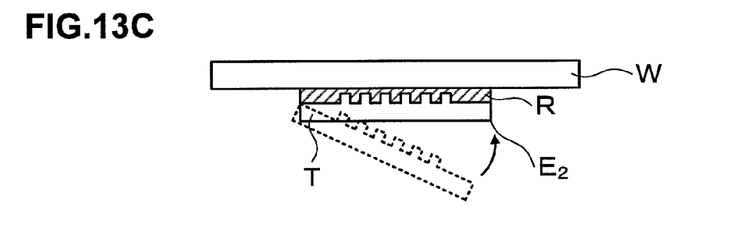
FIG. 13C illustrates a state in which a second end portion of the template is moved toward the wafer side.

Thereafter, as FIG. 13C illustrates, the second end portion $E_2$ of the template T is moved toward the wafer W side. Then, as FIG. 7B illustrates, the resist liquid R diffuses via the capillary action toward the second end portion $E_2$ of the template T.

Then, as FIG. 13C illustrates, until the above-described second distance $H_2$ is equal to the first distance $H_1$, that is, until the template T and the wafer W become parallel, the second end portion $E_2$ of the template T is moved toward the wafer W side. Then, as FIG. 7C illustrates, the resist liquid R diffuses over the entire surface between the template T and the wafer W.

Figures 13D, 13E:
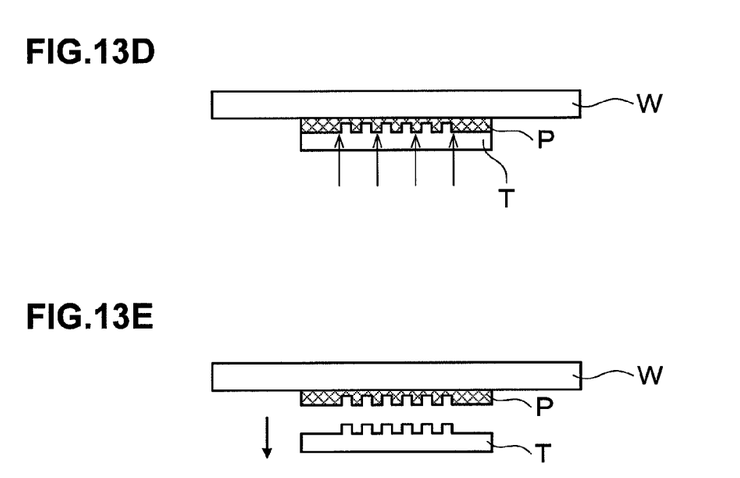
FIG. 13D illustrates a state in which the resist liquid is irradiated with light.
FIG. 13E illustrates a state in which the template is lowered.

Next, as FIG. 13D illustrates, the resist liquid R on the wafer W is irradiated with light from the light source 47. The light from the light source 47 transmits through the template T and radiates on the resist liquid R on the wafer W. This allows the resist liquid R to be cured and photo-polymerized. As described above, the transfer pattern C of the template T is transferred onto the resist liquid R on the wafer W, and the resist pattern P is formed.

Thereafter, as FIG. 13E illustrates, the template T is lowered. Thus, the resist pattern P is formed on the wafer W, and the imprint process terminates.

In the present embodiment, the resist liquid R continuously diffuses between the template T and the wafer W. Therefore, atmosphere between the template T and the wafer W can be driven to outside. Therefore, the resist liquid R can be adequately applied between the template T and the wafer W, without causing air bubbles to occur. As described above, the present invention can be applied to either case whether the template T is arranged above or below the wafer W.

In the above embodiment, at S3, the second end portion $E_2$ of the template T is moved toward the wafer W side. However, it is also possible that the wafer W is moved toward the template T side. In this case, for example, the wafer W may be moved in the vertical direction by using the wafer moving mechanism 24.

The resist liquid R used in the above embodiment may be a deaerated resist liquid. In this case, the deaerated resist liquid has a high air bubble dissolving capability. Therefore, air bubble occurrence between the template T and the wafer W can be more surely inhibited.

In the above, with reference to the drawings, the preferred embodiments of the present invention are explained. However, the present invention is not limited to these examples. It is clear that, for a person skilled in the art, various variation examples and modification examples can be conceived within the scope of the ideas described in the appended claims, and it is understood that these variation examples and modification examples naturally belong to the technical scope of the present invention. The present invention is not limited to this example, and can be carried out in various modes. The present invention is also applicable to a case where the substrate is a substrate other than a wafer, such as a flat panel display (FPD) and a mask reticle for a photomask.

The present invention is useful when applying an application liquid between a template having a transfer pattern formed on a surface thereof and a substrate, and transferring the transfer pattern onto the application liquid.

What is claimed is:

1. An imprint method for applying an application liquid between a template having a transfer pattern formed on a surface thereof and a substrate, and transferring the transfer pattern onto the application liquid, comprising:
   an arrangement step inclinedly arranging the template with respect to the substrate in a manner that the surface of the template opposes the substrate, and that a first distance between a first end portion of the template and the substrate is a distance that causes a capillary action of the application liquid to occur between the template and the substrate, and a second distance between a second end portion of the template that opposes the first end portion and the substrate is a distance that does not cause the capillary action of the application liquid to occur;
   thereafter, a supply step supplying the application liquid from an outer side of the first end portion to the first end portion; and
   thereafter, a movement step relatively moving the second end portion and the substrate so that the second distance becomes equal to the first distance.

2. The imprint method according to claim 1, wherein, at the movement step, the second end portion is moved toward the substrate side.

3. The imprint method according to claim 1, wherein the template has a rectangular shape in a plan view, and at the supply step, the application liquid is supplied to one point of the first end portion.

4. The imprint method according to claim 1, wherein the template has a rectangular shape in a plan view, and at the supply step, the application liquid is continuously supplied along the first end portion.

5. The imprint method according to claim 1, wherein, at the movement step, the supplying of the application liquid at the supply step is continued to be intermittently performed.

6. The imprint method according to claim 1, wherein a state of the application liquid at the movement step is inspected, and,
   base on a result of this inspection, at least the arrangement of the template at the arrangement step or the relative movement of the second end portion and the substrate at the movement step is controlled.

7. A computer-readable non-transitory storage medium storing a program that runs on a computer of a controller controlling an imprint apparatus in order to execute, by using the imprint apparatus, an imprint method for applying an application liquid between a template having a transfer pattern formed on a surface thereof and a substrate, and transferring the transfer pattern onto the application liquid, the imprint method comprising:
   an arrangement step inclinedly arranging the template with respect to the substrate in a manner that the surface of the template opposes the substrate, and that a first distance between a first end portion of the template and the substrate is a distance that causes a capillary action of the application liquid to occur between the template and the substrate, and a second distance between a second end portion of the template that opposes the first end portion and the substrate is a distance that does not cause the capillary action of the application liquid to occur;
   thereafter, a supply step supplying the application liquid from an outer side of the first end portion to the first end portion; and
   thereafter, a movement step relatively moving the second end portion and the substrate so that the second distance becomes equal to the first distance.

8. An imprint apparatus for applying an application liquid between a template having a transfer pattern formed on a surface thereof and a substrate, and transferring the transfer pattern onto the application liquid, comprising:
   a template holding part holding the template;
   a movement mechanism relatively moving the template held by the template holding part and the substrate;
   an application liquid supply part supplying the application liquid; and
   a controller, the controller being configured to
      control the movement mechanism to execute an arrangement step inclinedly arranging the template with respect to the substrate in a manner that the surface of the template opposes the substrate, and that a first distance between a first end portion of the template and the substrate is a distance that causes a capillary action of the application liquid to occur between the template and the substrate, and a second distance between a second end portion of the template that opposes the first end portion and the substrate is a distance that does not cause the capillary action of the application liquid to occur,
      thereafter, control the application liquid supply part to execute a supply step supplying the application liquid from an outer side of the first end portion to the first end portion, and
      thereafter, control the movement mechanism to execute a movement step relatively moving the second end portion and the substrate so that the second distance becomes equal to the first distance.

9. The imprint apparatus according to claim 8, wherein, the controller controls, at the movement step, the movement mechanism to move the second end portion toward the substrate side.

10. The imprint apparatus according to claim 8, wherein the template has a rectangular shape in a plan view, and the controller controls, at the supply step, the application liquid supply part to supply the application liquid to one point of the first end portion.

11. The imprint apparatus according to claim 8, wherein the template has a rectangular shape in a plan view, and the controller controls, at the supply step, the application liquid supply part to continuously supply the application liquid along the first end portion.

12. The imprint apparatus according to claim 8, wherein, the controller controls, at the movement step, the application liquid supply part to continue to intermittently perform the supplying of the application liquid at the supply step.

13. The imprint apparatus according to claim 8 further comprising an inspection part inspecting a state of the application liquid at the movement step, wherein,
   the controller controls, based on an inspection result of the inspection part, the movement mechanism to adjust at least the arrangement of the template at the arrangement step or the relative movement of the second end portion and the substrate at the movement step.

14. An imprint apparatus for applying an application liquid between a template having a transfer pattern formed on a surface thereof and a substrate, and transferring the transfer pattern onto the application liquid, comprising:
   a template holding part holding an outer periphery of a back surface of the template;

a plurality of movement mechanisms provided in an outer periphery of the template holding part and independently adjusting vertical positions of four corners of the template relative to the substrate;

an application liquid supply nozzle supplying the application liquid;

a rail formed from a lateral side of one end portion to a lateral side of another end portion in a diametrical direction of the substrate;

an arm attached to the rail and supporting the application liquid supply nozzle;

a driving part moving the arm upward and downward direction and in a direction along the rail.

\* \* \* \* \*